United States Patent
Yang et al.

(10) Patent No.: US 10,673,449 B1
(45) Date of Patent: Jun. 2, 2020

(54) DIGITAL-TO-ANALOG CONVERTER WITH GLITCH-IRRELEVANT REFERENCE VOLTAGE TO INCREASE LINEARITY

(71) Applicant: QUALCOMM Incorporated, San Diego, CA (US)

(72) Inventors: Chien-Chung Yang, San Diego, CA (US); Dongyang Tang, San Diego, CA (US); Vijayakumar Dhanasekaran, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/398,962

(22) Filed: Apr. 30, 2019

(51) Int. Cl.
*H03M 1/06* (2006.01)

(52) U.S. Cl.
CPC .................. *H03M 1/0678* (2013.01)

(58) Field of Classification Search
CPC ....... H03M 1/0678; H03M 1/66; H03M 1/747
USPC .................................. 341/118, 144
See application file for complete search history.

(56) References Cited

U.S. PATENT DOCUMENTS

| | | | |
|---|---|---|---|
| 4,618,852 A * | 10/1986 | Kelley | H03M 1/86 341/127 |
| 4,833,473 A | 5/1989 | Dingwall | |
| 5,940,020 A * | 8/1999 | Ho | H03M 1/682 341/145 |
| 6,664,906 B2 | 12/2003 | Volk | |
| 7,015,847 B1 * | 3/2006 | McLachlan | H03M 1/1205 341/144 |
| 7,417,572 B1 * | 8/2008 | Williams | H03M 1/747 341/136 |
| 7,432,844 B2 * | 10/2008 | Mueck | H03M 1/0682 341/161 |
| 7,773,013 B1 * | 8/2010 | Williams | H03M 1/747 341/136 |
| 9,154,148 B2 | 10/2015 | Schafferer et al. | |
| 9,300,318 B1 * | 3/2016 | Medina Sanchez-Castro | H03M 1/0863 |
| 2007/0096965 A1 * | 5/2007 | Gillespie | H03M 1/0607 341/144 |
| 2008/0129573 A1 * | 6/2008 | Mueck | H03M 1/0682 341/163 |
| 2017/0063368 A1 | 3/2017 | Tang et al. | |

FOREIGN PATENT DOCUMENTS

WO    2009034494 A1    3/2009

* cited by examiner

*Primary Examiner* — Jean B Jeanglaude
(74) *Attorney, Agent, or Firm* — Haynes and Boone, LLP

(57) ABSTRACT

A digital-to-analog converter has both a plurality of DAC stages and a plurality of dummy stages. Each DAC stage causes a glitch or disturbance to a pair of reference voltages when the DAC stage changes its switching state. Each dummy stage also causes a similar glitch or disturbance to the pair of reference voltages when the dummy stage changes its switching state. The dummy stages are controlled to change their switching state responsive to how many DAC stages change their switching state such that a total glitch induced onto the reference voltages remains substantially constant across a succession of digital words converted by the digital-to-analog converter into an analog output signal.

22 Claims, 4 Drawing Sheets

DIGITAL-TO-ANALOG CONVERTER WITH GLITCH-IRRELEVANT REFERENCE VOLTAGE TO INCREASE LINEARITY

TECHNICAL FIELD

This application relates to digital-to-analog converters, and more particularly to a digital-to-analog converter having a glitch-irrelevant reference voltage for improved linearity.

BACKGROUND

For low-noise operation with high linearity, a digital-to-analog converter (DAC) requires a clean reference voltage. However, conventional DACs may suffer from a frequency-dependent distortion resulting from a disturbance or glitch of its reference voltage(s). In particular, as the DAC is driven to produce an output sinusoid, the frequency-dependent glitch on its reference voltage produces undesirable harmonic output frequencies in addition to the desired output sinusoid. For example, a conventional resistive DAC (RDAC) 100 including a plurality of RDAC stages 115 is shown in FIG. 1 (for illustration clarity, just one RDAC stage 115 is shown in FIG. 1) that uses both a positive reference voltage (Vrefp) and a negative reference voltage (Vrefn). A buffer 105 generates the positive and negative reference voltages. The positive reference voltage is carried on a positive voltage rail whereas the negative reference voltage is carried on a negative voltage rail.

Each RDAC stage 115 includes a switch matrix 130 formed by a switch S1, a switch S2, a switch S3, and a switch S4. Switch matrix 130 has two complementary states as controlled by a bit C and its complement Cb. Depending upon the state for switch matrix 130, the positive voltage rail couples through a corresponding resistor R1 to either a non-inverter input 135 or an inverting input 140 of an amplifier 125 in an amplifier stage 120 such as for a headphone (HPH). The negative rail couples through the remaining resistor R1 to whatever input of amplifier 125 that is not coupled to the positive voltage rail. The various bits input to RDAC stages 115 represent a digital word that is converted by RDAC 100 into a corresponding analog output signal from amplifier 125.

Suppose that a succession of the digital words codes for a sinusoidal output signal at some fundamental frequency. At each new digital word, some of the RDAC stages 115 will switch their switching state. For example, instead of charging non-inverting input 135 with the positive reference voltage, the corresponding switch matrix 130 is instead switched so that the positive reference voltage charges inverting input 140. Every time an RDAC stage 115 switches between its switching states, the parasitic capacitances for its switch matrix 130 causes a glitch or disturbance on the positive and negative reference voltages. This glitch is relatively small if only a few RDAC stages 115 switch their switching state but is relatively large if more and more of RDAC stages 115 switch their switching state. At the peaks and valleys of the sinusoidal output signal, relatively few RDAC stages 115 switch whereas significantly more switch during the rising and falling edges for the sinusoidal output signal. The glitches on the reference voltages will thus rise in magnitude at twice the fundamental frequency for the sinusoidal output signal. The resulting harmonic disturbance of the reference voltages causes a corresponding harmonic disturbance of the sinusoidal output signal.

Accordingly, there is a need in the art for resistive digital-to-analog converters with stable reference voltages that are not subject to harmonic glitches.

SUMMARY

To prevent a harmonic disturbance of the reference voltages from distorting an analog output signal for a digital-to-analog converter (DAC), the DAC includes a plurality of dummy stages that mimic the glitch behavior for a plurality of DAC stages. Depending upon the digital word being converted, each DAC stage may change its switching state with respect to a pair of reference voltages. This change of state causes a glitch or disturbance to each of the reference voltages. As the number of DAC stages that change their switching states increases, the total glitch to each of the reference voltages increases. Without the operation of the dummy stages, the variation of the total glitch for each reference voltage would tend to induce distortion into the analog output signal. But the dummy stages are controlled to have a sufficient number of the dummy stages change state for each digital word such that the total glitch for the reference voltages is maintained substantially constant.

These and other advantageous features may be better appreciated through the following detailed description.

BRIEF DESCRIPTION OF THE DRAWINGS

Implementations of the present disclosure and their advantages are best understood by referring to the detailed description that follows. It should be appreciated that like reference numerals are used to identify like elements illustrated in one or more of the figures.

DETAILED DESCRIPTION

Figure 1:
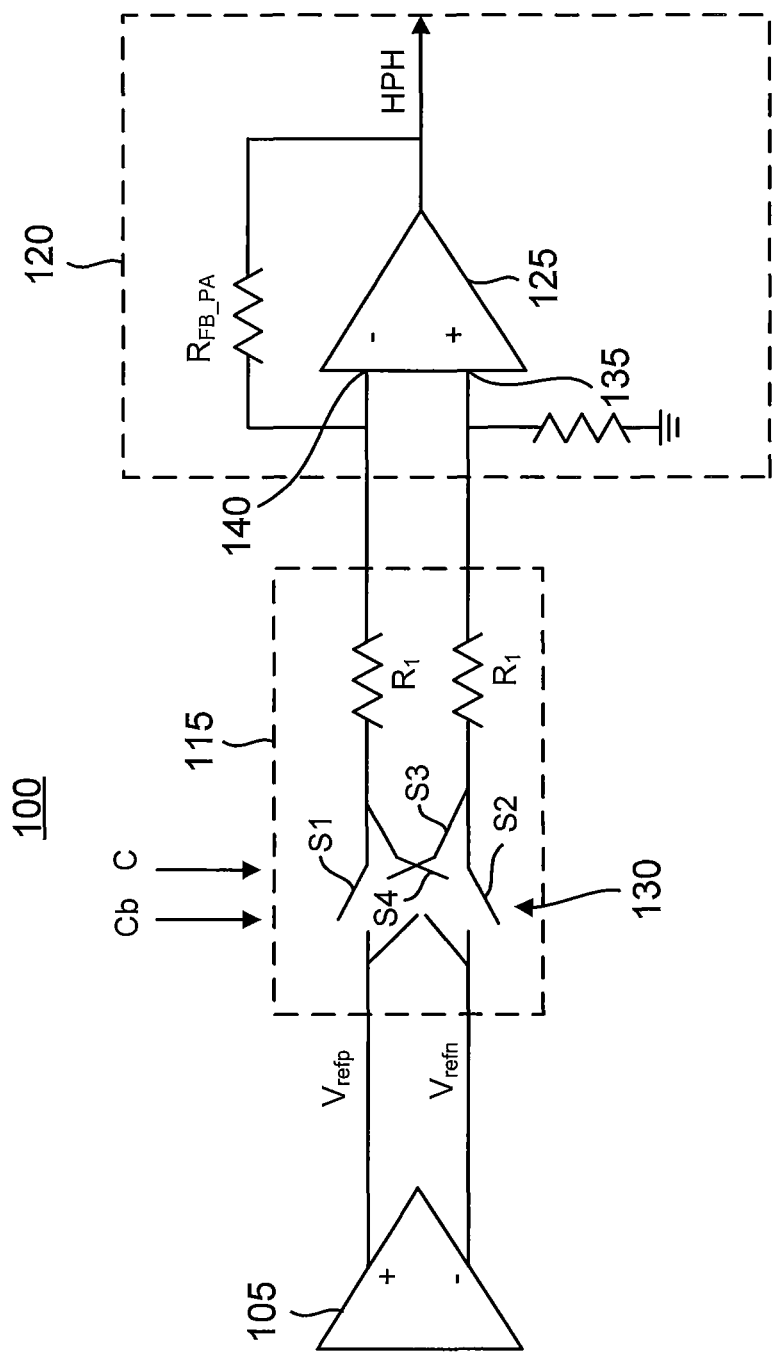
FIG. 1 is a diagram of a conventional resistive digital-to-analog converter (RDAC).

The parasitic capacitances for the transistor switches in a switch matrix for a DAC stage are inherent to the operation of transistor switches. There will thus be a glitch or disturbance of the DAC's reference voltage(s) due to these parasitic effects whenever a DAC stage's switch matrix switches between its switching states. With regard to this switching of states, a DAC stage responds to a binary input bit (or bits). Should the binary bit be true, the DAC stage's switch matrix has a first DAC switching state that is reversed into a second DAC switching state should the binary bit be false. As used herein, an DAC stage is deemed to switch between the first DAC switching state and the second DAC switching state whenever its corresponding input bit has changed states. The various input bits for the plurality of DAC stages in a DAC form a digital word. As known in the DAC arts, a DAC converts a succession of such digital words into an output signal. A DAC will thus respond to a current digital word that may be or may not be changed with respect to a preceding digital word that was converted by the DAC. If just one bit has changed states in the current digital word as compared to the preceding digital word, just one DAC stage will switch its DAC switching state in response to the current digital word. Conversely, if every bit has changed states, then all the DAC stages will change their DAC switching states in response to the current digital word. The number of DAC stages that change DAC switching states will thus depend upon the difference between the current digital word and the preceding digital word. As noted earlier, this difference between the current digital word and the preceding digital word over a succession of digital words that codes for an output sinusoid would typically produce a harmonic disturbance or glitch on the reference voltages for the DAC that in turn produces a harmonic disturbance in the DAC's output sinusoid.

The improved DACs disclosed herein exploit this difference between the current digital word and the preceding digital word such that the glitch produced on the reference voltages is substantially constant, thereby eliminating or sharply reducing the output distortion. To do so, the disclosed DACs includes a plurality of dummy stages. As implied by the name "dummy," these dummy stages do not contribute to the output of the DAC but instead mimic or duplicate the glitch produced on the reference voltages when an actual RDAC stage switches states. Each dummy stage produces a glitch on the reference voltages when the dummy stage switches between a first dummy switching state and a second dummy switching state. The dummy-stage-induced glitch is substantially the same or a duplicate of the glitch produced on the reference voltage when an RDAC stage changes state. A logic circuit controls the dummy stages to switch in a complementary fashion to the switching of the real DAC stages such that the total number of switching stages (both real and dummy) is maintained constant or substantially constant. As noted earlier, the parasitic capacitances of the transistor switches in a DAC stage's switch matrix are an inherent property of real-world transistor switches. Since a glitch of the reference voltages from the switching of a DAC stage is essentially unavoidable, the logic circuit and dummy stages disclosed herein advantageously maintain the reference voltage glitch to be kept constant or substantially constant such that the output distortion that would otherwise occur from such glitches is eliminated or substantially reduced. Some example embodiments will now be discussed in more detail.

Figure 2:
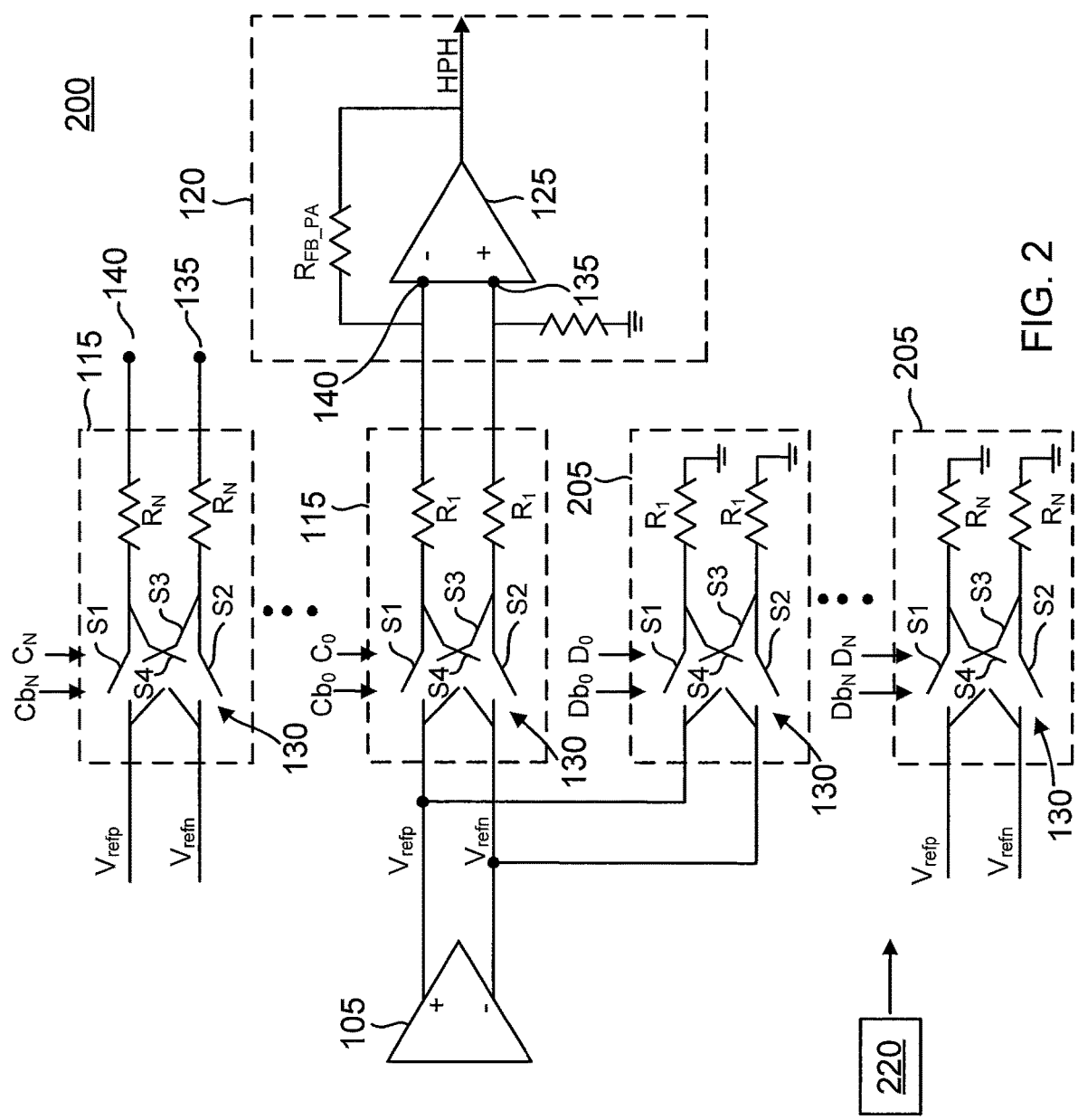
FIG. 2 is a diagram of an RDAC having a plurality of dummy RDAC stages in accordance with an aspect of the disclosure.

The following discussion will be directed to resistive DACs (RDACs) embodiments. But it will be appreciated that the switching of dummy stages as disclosed herein may be widely applied to any DAC having a plurality of switching stages. An example RDAC 200 is shown in FIG. 2. RDAC 200 includes a plurality of RDAC stages 115 that function as discussed with regard to conventional RDAC 100. In RDAC 200, there are N RDAC stages 115, where N is plural positive integer. Each RDAC stage 115 includes a switch matrix 130 formed by a switch S1, a switch S2, a switch S3, and a switch S4. In a first DAC switching state for each switch matrix 130, switches S1 and S2 are closed whereas switches S3 and S4 are open. In a second DAC switching state, switches S3 and S4 are closed whereas switches S1 and S2 are open. Depending upon the switching state, either the positive voltage rail (which may also be denoted as a first voltage rail) or the negative voltage rail (which may also be denoted as a second voltage rail) is connected to either an inverting input 140 or to a non-inverting input 135 of amplifier 125. Non-inverting input is also referred to herein as a first input. Similarly, inverting input 140 is also referred to herein as a second input. In the first DAC switching state, the positive voltage rail is coupled to negative input 140 and the negative voltage rail is coupled to non-inverting input 135. In the second DAC switching state, the positive voltage rail is coupled to non-inverting input 135 and the negative voltage rail is coupled to inverting input 140.

The N RDAC stages 115 range from a first RDAC stage 115 in which its switch matrix 130 responds to a first bit $C_0$ and its complement $Cb_0$ to a Nth RDAC stage 115 in which its switch matrix 130 responds to an Nth bit $C_N$ and its complement $Cb_N$. The N input bits $C_0$ through $C_N$ form a digital word that is converted by RDAC 200 into an analog output signal at the output of amplifier 125 in amplifier stage 120.

In each RDAC stage 115, the positive voltage rail connects through a resistor to the selected input of amplifier 125 as does the negative voltage rail. Each RDAC stage 115 thus has a pair of resistors (which also be denoted as a first resistor and a second resistor). The resistors may have a binary relationship across the various stages such that a resistance of resistors $R_1$ in a group of first RDAC stages 115 have one-half the resistance of resistors (not illustrated) in a second group of RDAC stages 115, and so on such that a group of Nth RDAC stages 115 with resistors $R_N$ would have the greatest resistance. Buffer 105 and amplifier stage 120 function as described regarding conventional RDAC 100. Amplifier 125 is stabilized by a feedback resistor $R_{FB\_P4}$ that couples from the output of amplifier 125 to its inverting input 140.

Each RDAC stage 115 is duplicated by a replica or dummy stage 20 having its own switch matrix 130 and a pair of resistors formed by a third resistor and a fourth resistor. Since the function of dummy stages 205 is merely to replicate the glitch caused by the switching of their companion RDAC stages 115, the switch matrices 130 in dummy stages 205 do not couple to the inverting input 140 or to the non-inverting input 135 of amplifier 125. Instead, the positive and negative voltage rails from buffer 105 may couple through a dummy stage's switch matrix 130 to an output node such as ground through the dummy stage's pair of resistors. Alternatively, the output node may be a reference voltage node. The resistors in each dummy stage 205 match the resistors in the corresponding RDAC stage 115. There are thus N dummy stages 205 ranging from a first dummy stage 205 having a pair of resistors $R_1$ to an Nth dummy stage having a pair of resistors $R_N$. Each dummy stage 205 thus duplicates its corresponding RDAC stage 115 but for the connection to the inputs 135 and 140 of amplifier 125. The switching states for a dummy stage 205 are defined by which voltage rail couples through which resistor to ground. There is thus a first dummy switching state in which the positive rail couples through the dummy stage's third resistor to the output node and in which the negative rail couples through dummy stage's fourth resistor to the output node. A second dummy switching state is the opposite of the first such that the positive voltage rail couples through the fourth resistor whereas the negative voltage rail couples through the third resistor.

A logic circuit 220 controls the switching state of dummy stages 205 by generating a plurality of control bits. For example, the switching of switch matrix 130 in first dummy stage 205 is controlled by a first control bit $D_0$ and its complement $Db_0$. Similarly, the switching of switch matrix 130 in Nth dummy stage 205 is controlled by an Nth control bit $D_N$ and its complement $Db_N$. The control bits $D_0$ through $D_N$ form a digital control word. Logic circuit 220 controls the control bits for dummy stages 205 based upon which RDAC stages 115 change their switching state (either from the first DAC switching state to the second DAC switching state or from the second DAC switching state to the first DAC switching state) responsive to the current digital word being converted by RDAC 200. As used herein, an RDAC stage 115 is deemed to have switched states when the voltage rail connections to non-inverting input 135 and inverting input 140 are reversed as compared to the connections that were taken for the preceding digital word. For example, suppose that the positive voltage rail is connected through switch matrix 130 to inverting input 140 for a given RDAC stage 115 in response to the preceding digital word. If the current digital word causes switch matrix 130 in the same RDAC stage 115 to instead couple the positive voltage rail to non-inverting input 135, then that RDAC stage 115 has changed its switching state. The negative voltage rail is connected to whatever input that is not connected to the positive voltage rail.

Based upon the current digital word, a certain number of RDAC stages 115 will thus change their switching states. In some embodiments, the number could be zero but that depends upon the RDAC implementation—for example, in a delta-sigma RDAC embodiment, one or more RDAC stages 115 will change their switching state for every digital word. Note that the maximum number of RDAC stages 115 that can change state depends upon the total number of RDAC stages 115 that are included in the plurality for RDAC 200. If there are a total of N RDAC stages 115, then N is the maximum number of RDAC stages 115 that could change switching state per each digital word. As the number of RDAC stages 115 that change their switching state increases, the total glitch induced onto the positive and negative reference voltages increases as well. To keep the glitch constant across each digital word, logic circuit 220 configures the digital control word to change the switching states in whatever dummy stage 205 whose counterpart RDAC stage 115 did not change switching states. In particular, the counterpart or corresponding RDAC stage 115 for first dummy stage 205 having resistors $R_1$ is first RDAC stage 115 having the same resistors $R_1$ (having the same resistance) as does first dummy stage 205. Each dummy stage 205 thus has a corresponding RDAC stage 115 of which the dummy stage 205 duplicates the RDAC stage's electrical behavior. Logic circuit 220 adjusts the digital control word so that each dummy stage 205 is switched when its corresponding RDAC stage 115 is not switched by the current digital word being converted into the analog output signal by RDAC 200. In this fashion, the glitch or disturbance on the positive and negative reference voltages from each digital word is the same or substantially the same such that there is no harmonic disturbance of the positive and negative reference voltages. There is thus no harmonic distortion of the analog output signal from amplifier 125 despite the glitches on the positive and negative reference voltages.

Figure 3:
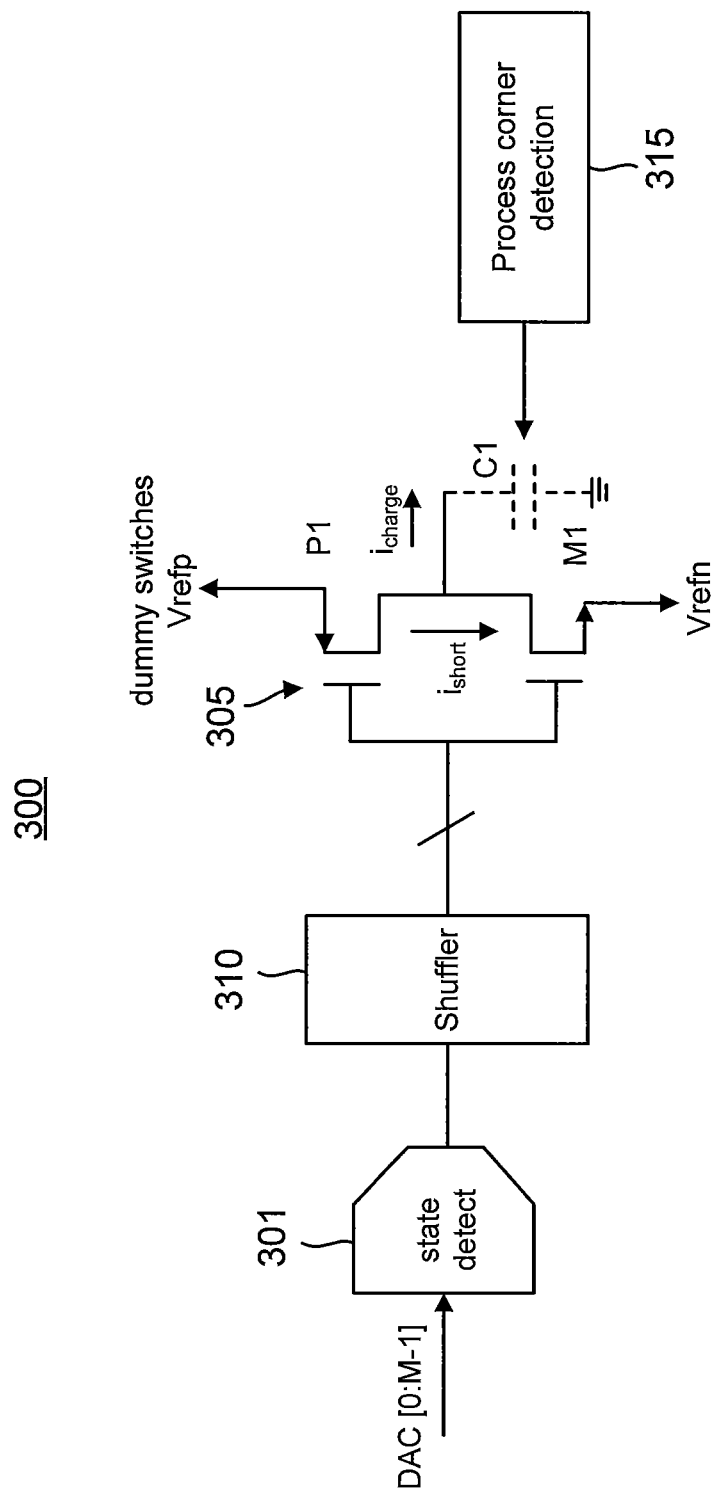
FIG. 3 is a diagram of an RDAC having a reduced plurality of dummy RDAC stages in accordance with an aspect of the disclosure.

RDAC 200 may be simplified such that the dummy stages are not electrical duplicates but instead only approximate the average electrical behavior of the various RDAC stages 115. For example, an RDAC 300 may include a plurality of dummy stages 305 as shown in FIG. 3. (for illustration clarity, only a single dummy stage 305 is shown in FIG. 3). The remaining elements such as RDAC stages 115, amplifier 125, and so on would be arranged as discussed for RDAC 200 but are not shown in FIG. 3 for illustration clarity. Each dummy stage 305 includes a p-type metal-oxide semiconductor (PMOS) transistor P1 and an n-type metal-oxide semiconductor (NMOS) transistor M1 to represent the behavior of a corresponding switch matrix 130 in an actual RDAC stage 115. A source for transistor P1 is tied to the positive voltage rail whereas a source for transistor M1 is connected to the negative voltage rail. The drains for transistors P1 and M1 form an output node that is connected to ground through a load capacitor C1 that represents the parasitic capacitance for the resistors and associated circuitry in RDAC stages 115 (as represented by an average value). Since this average value will vary depending upon the process corner, the capacitance of load capacitor C1 may be adjusted responsive to a process corner detection 315. A digital control word controls the switching state for each dummy stage 305. In particular, there is a control bit for each dummy stage 305 that drives the gates of transistors P1 and M1. Should the control bit be asserted by being charged to a supply voltage to effect a first dummy switching state, transistor M1 is switched on and transistor P1 switched off Conversely, if the control bit is de-asserted by being grounded to effect a second dummy switching state, transistor M1 is switched off while transistor P1 is switched on. Each time the dummy switching state for a dummy stage 305 is changed by changing the binary value of the corresponding control bit, a charge/discharge current ishort flows from the positive rail to the negative rail to approximate the glitch produced by the switching of an RDAC stage 115.

To save on die space, there need not be as many dummy stages 305 as there are RDAC stages. A logic circuit 301 detects the number of RDAC stages 115 that are changing state for a current digital word as compared to a previous digital word. In RDAC 300, there are M RDAC stages 115 so the current digital word is represented by the variable DAC:[0:M−1]. Logic circuit 301 functions so that the total number of RDAC stages 115 and dummy stages 305 that switch their switching state remains substantially constant. On average, there will be some dummy stages 305 that switch states whereas others will not. A shuffler 310 may randomize the selection of dummy stages 305 to select for dummy stages 305 were not switched for a previous digital word to reduce any random differences between dummy stages 305 on the glitching of the positive and negative reference voltages. Since dummy stages 305 are formed by a serial combination of transistors M1 and P1 and capacitor C1, each dummy stage 305 may serve as layout dummy as well such that no die space is wasted by the inclusion of dummy stages 305. In one embodiment, dummy stages 205 or dummy stages 305 may be deemed to form a means for maintaining a total disturbance of the first reference voltage and of the second reference voltage to be substantially constant across a succession of the digital words to be converted.

Figure 4:
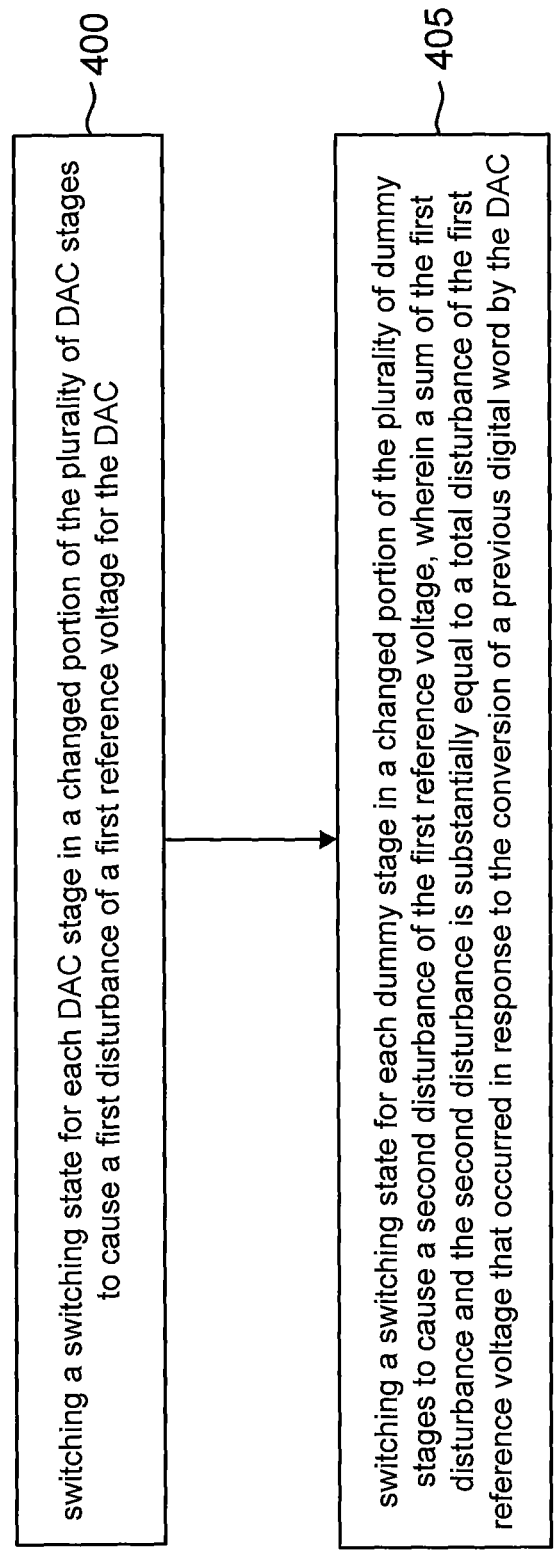
FIG. 4 is a flowchart for a method of operation of an RDAC having dummy stages for reducing or eliminating distortion in accordance with an aspect of the disclosure.

A method of operation for a resistive digital-to-analog converter that includes a plurality of RDAC stages and also includes a plurality of dummy stages will now be discussed with regard to the flowchart shown in FIG. 4. The method includes an act 400 that is responsive to a current digital word to be converted by the resistive digital-to-analog converter into an analog output signal. Act 400 includes changing a switching state for each RDAC stage in a changed portion of the plurality of RDAC stages while maintaining a unchanged switching state for each RDAC stage in an unchanged portion of the plurality of RDAC stages, wherein the changing of the switching state in each RDAC stage in the changed portion of the plurality of RDAC stages causes a disturbance for a reference voltage for the resistive digital-to-analog converter. Referring again to RDAC stages 115, those stages that are unchanged in response to a current digital word form the unchanged portion of act 400 whereas those stages that switch their switching states form the changed portion of act 400.

The method further includes an act 405 that is responsive to the unchanged portion of the plurality of RDAC stages. Act 405 includes changing a switching state for each dummy stage in a changed portion of the plurality of dummy stages, wherein the changing of the switching state in each dummy stage in the changed portion of the plurality of dummy stages substantially duplicates the disturbance for the reference voltage but does not affect the analog output signal. The changing of the switching states in either dummy stages 205 or dummy stages 305 is an example of act 405.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

We claim:

1. A digital-to-analog converter (DAC), comprising:
a first voltage rail for a first reference voltage;
a second voltage rail for a second reference voltage;
an amplifier having a first input;
a plurality of DAC stages corresponding to a plurality of bits for a digital word to be converted into an analog output signal from the amplifier, each DAC stage being configured to respond to the corresponding bit to switch between a first DAC switching state in which the first voltage rail is coupled to the first input and a second DAC switching state in which the second voltage rail is coupled to the first input; and
a plurality of dummy stages, each dummy stage being configured to have a first dummy switching state in which the first voltage rail is coupled to an output node and a second dummy switching state in which the second voltage rail is coupled to the first output node.

2. The DAC of claim 1, wherein the amplifier includes a second input, and wherein each DAC stage is further configured in the first DAC switching state to couple the second voltage rail to the second input, and wherein each DAC stage is further configured in the second DAC switching state to couple the first voltage rail to the second input.

3. The DAC of claim 2 wherein the DAC is a resistive DAC (RDAC) and the plurality of DAC stages comprises a plurality of RDAC stages, and wherein each dummy stage comprises a first load resistor and a second load resistor, and wherein each dummy stage is further configured in the first dummy switching state to couple the first voltage rail to the output node through the first load resistor and to couple the second voltage rail through the second load resistor to the output node, and wherein each dummy stage is further configured in the second dummy switching state to couple the first voltage rail to the output node through the second load resistor and to couple the second voltage rail to the output node through the first load resistor.

4. The DAC of claim 3, wherein the output node is ground.

5. The DAC of claim 3, wherein a total number of the RDAC stages in the plurality of RDAC stages equals a total number of the dummy stages in the plurality of dummy stages, and wherein each dummy stage is configured to electrically model a corresponding one of the RDAC stages.

6. The DAC of claim 5, further comprising a logic circuit configured to command each dummy stage to switch between the first dummy switching state and the second dummy switching state responsive to whether the corresponding RDAC stage has switched between the first DAC switching state and the second DAC switching state in response to the digital word.

7. The DAC of claim 2, further comprising a capacitive load coupled between the output node and ground.

8. The DAC of claim 7, wherein a total number of the DAC stages is greater than a total number of the dummy stages.

9. The DAC of claim 8, further comprising a logic circuit configured to command each dummy stage to switch between the first dummy switching state and the second dummy switching state responsive to how many of the DAC stages has switched between the first DAC switching state and the second DAC switching state in response to the digital word.

10. The DAC of claim 1, further comprising a buffer configured to drive the first reference voltage onto the first voltage rail and to drive the second reference voltage onto the second voltage rail.

11. The DAC of claim 1, wherein each DAC stage includes a first resistor, a second resistor, and a switch matrix, and wherein the switch matrix in each DAC stage is configured in the first DAC switching state to couple the first voltage rail through the first resistor to the first input and to couple the second voltage rail through the second resistor to a second input for the amplifier, and wherein the switch matrix in each DAC stage is configured in the second DAC switching state to couple the second voltage rail through the first resistor to the first input and to couple the first voltage rail through the second resistor to the second input.

12. The DAC of claim 11, wherein each dummy stage includes a third resistor, a fourth resistor, and a switch matrix, and wherein the switch matrix in each dummy stage is configured in the first dummy switching state to couple the first voltage rail through the third resistor to the output node and to couple the second voltage rail through the fourth resistor to the output node, and wherein the switch matrix in each dummy stage is further configured in the second dummy switching state to couple the first voltage rail through the fourth resistor to the output node and to couple the second voltage rail through the third resistor to the output node.

13. The DAC of claim 11, wherein each dummy stage comprises a p-type metal-oxide semiconductor (PMOS) transistor having a source connected to the first voltage rail and a drain connected to the output node and includes an n-type metal-oxide semiconductor transistor (NMOS) having a source connected to the second voltage rail and having a drain connected to the output node.

14. The DAC of claim 13, further comprising a capacitive load coupled between the output node and ground.

15. A method for a digital-to-analog converter (DAC) having a plurality of DAC stages and a plurality of dummy stages, comprising:
responsive to a current digital word to be converted into an analog output signal, changing a switching state for each DAC stage in a changed portion of the plurality of DAC stages while maintaining a unchanged switching state for each DAC stage in an unchanged portion of the plurality of DAC stages, wherein the changing of the switching state in each DAC stage in the changed portion of the plurality of DAC stages causes a disturbance for a first reference voltage for the digital-to-analog converter; and responsive to the unchanged portion of the plurality of DAC stages, changing a switching state for each dummy stage in a changed portion of the plurality of dummy stages, wherein the changing of the switching state in each dummy stage in the changed portion of the plurality of dummy stages substantially duplicates the disturbance for the first reference voltage.

16. The method of claim 15, further comprising:
controlling the dummy stages so that a sum of a total number of dummy stages in the changed portion of the plurality of dummy stages and a total number of DAC stages in the changed portion of the plurality of DAC stages equals a constant.

17. The method of claim 15, further comprising:
controlling the plurality of dummy stages so that a sum of a total number of dummy stages in the changed portion of the plurality of dummy stages and a total number of DAC stages in the changed portion of the plurality of DAC stages substantially equals a constant.

18. The method of claim 15, wherein the changing of the switching state in each DAC stage in the changed portion of the plurality of DAC stages also causes a disturbance to a second reference voltage for the DAC, and wherein the changing of the switching state in each dummy stage in the changed portion of the plurality of dummy stages substantially causes the disturbance to the second reference voltage.

19. The method of claim 18, further comprising converting a succession of digital words in the DAC into the analog output signal, wherein the disturbance for the first reference voltage and the disturbance for the second reference voltage is substantially constant across the succession of digital words.

20. A digital-to-analog converter (DAC), comprising:
a first voltage rail for a first reference voltage;
a second voltage rail for a second reference voltage;
an amplifier having a first input;
a plurality of DAC stages corresponding to a plurality of bits for each current digital word in a succession of digital words to be converted into an analog output signal from the amplifier, each DAC stage including a switch matrix configured to respond to the corresponding bit in the current digital word to select between a first switching state in which the first voltage rail is coupled to the first input and a second switching state in which the second voltage rail is coupled to the first input, and wherein each DAC stage is configured to cause a disturbance to the first reference voltage and to the second reference voltage in response to a switch between the first switching state and the second switching state; and
means for maintaining a total disturbance of the first reference voltage and of the second reference voltage to be substantially constant across the succession of the digital words.

21. The DAC of claim 20, wherein the amplifier includes a second input, and wherein the switch matrix in each DAC stage is further configured in the first switching state to couple the second voltage rail to the second input, and wherein the switch matrix in each DAC stage is further configured in the second switching state to couple the first voltage rail to the second input.

22. The DAC of claim 20, wherein the switch matrix in each DAC stage comprises a plurality of four switches.

* * * * *